(12) United States Patent
Dou et al.

(10) Patent No.: US 11,198,297 B2
(45) Date of Patent: Dec. 14, 2021

(54) INKJET PRINTING DEVICE AND OPERATION METHOD THEREOF

(71) Applicants: Hefei Xinsheng Optoelectronics Technology Co., Ltd., Anhui (CN); BOE Technology Group Co., Ltd., Beijing (CN)

(72) Inventors: Yikun Dou, Beijing (CN); Yang Xu, Beijing (CN); Han Yan, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/661,502

(22) Filed: Oct. 23, 2019

(65) Prior Publication Data

US 2020/0198354 A1 Jun. 25, 2020

(30) Foreign Application Priority Data

Dec. 25, 2018 (CN) .......................... 201822186756.6

(51) Int. Cl.
*B41J 2/16* (2006.01)
*B41J 2/165* (2006.01)

(52) U.S. Cl.
CPC ................ *B41J 2/16532* (2013.01)

(58) Field of Classification Search
CPC ................ B41J 2/16532; B41J 2/16517; H01L 51/0005
See application file for complete search history.

(56) References Cited

U.S. PATENT DOCUMENTS

2011/0273510 A1\* 11/2011 Sugimoto ............ B41J 2/16552
347/22

\* cited by examiner

*Primary Examiner* — Lamson D Nguyen
(74) *Attorney, Agent, or Firm* — Banner & Witcoff, Ltd.

(57) ABSTRACT

An inkjet printing device and an operation method of the inkjet printing device are provided. The inkjet printing device includes a printing sprayer head, the printing sprayer head includes a nozzle and a cleaner component, the cleaner device includes a cleaner and a vacuum system, the cleaner is configured to be communicated with the nozzle, and the cleaner is communicated with the vacuum system.

19 Claims, 5 Drawing Sheets

INKJET PRINTING DEVICE AND OPERATION METHOD THEREOF

CROSS REFERENCE TO RELATED APPLICATIONS

The present application claims priority of Chinese Patent Application No. 201822186756.6 filed on Dec. 25, 2018, the disclosure of which is incorporated herein by reference in its entirety as part of the present application.

TECHNICAL FIELD

Embodiments of the present disclosure relate to an inkjet printing device and an operation method of the inkjet printing device.

BACKGROUND

The inkjet printing technology involves producing ink droplets at first and then using an inkjet head to guide the ink droplets to set positions, and has many advantages such as good print pattern quality, rich in level and clean details. At present, the inkjet printing technology has been applied to the manufacturing field of display devices. For example, in the manufacturing process of an organic light-emitting diode (OLED) panel, both the production of a novel R/G/B light-emitting unit and the coating of a thin-film encapsulation (TFE) organic layer employ the inkjet printing technology.

SUMMARY

The embodiments of the present disclosure provide an inkjet printing device including a printing sprayer head, the printing sprayer head includes a nozzle, the inkjet printing device further includes a cleaner component including a cleaner and a vacuum system, the cleaner is configured to be communicated with the nozzle and the cleaner is communicated with the vacuum system.

For example, the vacuum system includes an exhauster and a connecting pipe, and the exhauster is communicated with the cleaner through the connecting pipe.

For example, the cleaner is provided with a nozzle hole in which the nozzle is configured to be inserted, and the nozzle hole is communicated with the vacuum system.

For example, the vacuum system includes an exhauster and a connecting pipe, and the exhauster is connected with the nozzle hole through the connecting pipe to form a channel between the exhauster and the nozzle hole.

For example, the vacuum system further includes a pressure measurer component which is configured to measure a pressure in the connecting pipe.

For example, the printing sprayer head includes a plurality of nozzles, the printing sprayer head further includes a sprayer body and a valve, the plurality of nozzles are all connected with the sprayer body, and the valve is configured to switch each nozzle between an open state and a closed state.

For example, the printing sprayer head further includes a rotary driver component; as for each nozzle, the nozzle is movably connected with the sprayer body, and the rotary driver component is configured to drive the nozzle to rotate around an axis relative to the sprayer body and thus to switch the nozzle between an operating position and a non-operating position; as for each nozzle, the nozzle is opened by the valve in a situation where the nozzle is at the operating position, and the nozzle is closed by the valve in a situation where the nozzle is at the non-operating position.

For example, the sprayer body includes an ink chamber, a concave surface is at an end of the sprayer body facing the nozzle, the concave surface is provided with a first connecting hole, and the first connecting hole is communicated with the ink chamber; the valve includes a control tube which is horizontally arranged; the rotary driver component is configured to drive the control tube to rotate around a central axis of the control tube and thus to drive the nozzle to rotate around the axis relative to the sprayer body, and the central axis of the control tube is the axis; a plurality of second connecting holes are at a lateral surface of the control tube and are spaced apart from each other along a circumferential direction of the control tube, and the first connecting hole and the plurality of second connecting holes are in a same plane perpendicular to the central axis of the control tube; the plurality of nozzles are all connected with the lateral surface of the control tube and are spaced apart from each other along the circumferential direction of the control tube, and each nozzle is configured to be communicated with the second connecting hole that each nozzle corresponds to; as for each nozzle, with rotation of the control tube around the central axis of the control tube, in a situation where the nozzle rotates to the operating position, at least a portion of the second connecting hole communicated with the nozzle is opposite to the first connecting hole, and the lateral surface of the control tube is sealed with the concave surface.

For example, an axis of the first connecting hole is vertically arranged; and a difference between a position of each nozzle in the circumferential direction of the control tube and a position of the second connecting hole that each nozzle corresponds to in the circumferential direction of the control tube is 180°.

For example, the nozzle includes an inkjet hole, and the printing sprayer head further includes a pressure sensor which is configured to measure a pressure in the inkjet hole.

For example, the pressure sensor is a thin-film pressure sensor and is at a wall of the inkjet hole.

For example, the nozzle includes an inkjet hole; the inkjet printing device further includes an ink droplet driver component which includes an gas supply source, a vent pipe and a control valve; a first end of the vent pipe is connected with the gas supply source, and a second end of the vent pipe is connected with the inkjet hole; the control valve is at the vent pipe, and an opening size of the control valve is adjustable.

For example, a position where the second end of the vent pipe is connected with the inkjet hole is close to an inlet end of the inkjet hole.

For example, the nozzle is provided with an inkjet hole and includes a housing and a capillary tube, the capillary tube is in the housing, and a tube hole of the capillary tube is an inkjet hole.

For example, the nozzle further includes a hydrophobic layer which covers an inner wall of the capillary tube.

For example, the inkjet printing device further includes a printing chamber and a driver component, and the printing sprayer head, the cleaner component and the driver component are in the printing chamber; and under driving of the driver component, the cleaner component is movable relative to the printing sprayer head in both a horizontal direction and a vertical direction, so that the nozzle is insertable into the nozzle hole.

For example, the inkjet printing device further includes a substrate carrier which is in the printing chamber, the printing sprayer head is on an upper side of the substrate carrier, the substrate carrier includes a substrate placing area, the cleaner component is movably disposed on the substrate carrier and arranged outside the substrate placing area, and an axis of the nozzle hole is vertical; the driver component includes a first driver component and a second driver component; the first driver component is configured to drive the printing sprayer head to move relative to the substrate carrier along the horizontal direction, so that the nozzle is opposite to the nozzle hole; and the second driver component is configured to drive the cleaner component to move relative to the substrate carrier along the vertical direction.

At least one embodiment of the present disclosure further provides an operation method of the inkjet printing device, and the operation method includes: in a printing process, determining whether the nozzle of the printing sprayer head is blocked; and in presence of a determination result that the nozzle is blocked, allowing the cleaner component to be communicated with the nozzle, and utilizing the vacuum system to suck out a blockage in the nozzle.

For example, the operation method further includes: in the printing process, in a situation where the nozzle of the printing sprayer head is blocked, rotating the nozzle that is blocked to a non-operating position, utilizing the vacuum system to suck out the blockage in the nozzle, and rotating another nozzle of the printing sprayer head to an operating position to continue printing.

For example, the operation method further includes: in the printing process, introducing a gas into the nozzle of the printing sprayer head.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Inkjet printing is performed by an inkjet printing device. For instance, the inkjet printing device in relevant art includes a printing sprayer head (also called as an inkjet head or a printing head). In a printing process, the printing sprayer head moves to upper sides of pixel hollows (pixel banks) of a substrate to be printed, and a nozzle of the printing sprayer head sprays out ink droplets to fill the ink droplets into the pixel hollows, respectively.

The inventors of the application noted in the study that in the inkjet printing process, large particulate matters in the ink or a solute precipitated from the ink due to the volatility of an solvent of the ink can easily clog the nozzle of the printing sprayer head, and thus the printing sprayer head fails to spray out ink normally; and in order to allow the printing sprayer head to restore normal ink jetting, the nozzle needs to be disassembled for clear-out, which consumes too much time and is not conducive to improving the efficiency of the inkjet printing device.

The embodiments of the present disclosure provide an inkjet printing device, which avoids or eliminates the reduction of the working efficiency of the inkjet printing device caused by the reason that the nozzle can be easily blocked.

Figure 1:
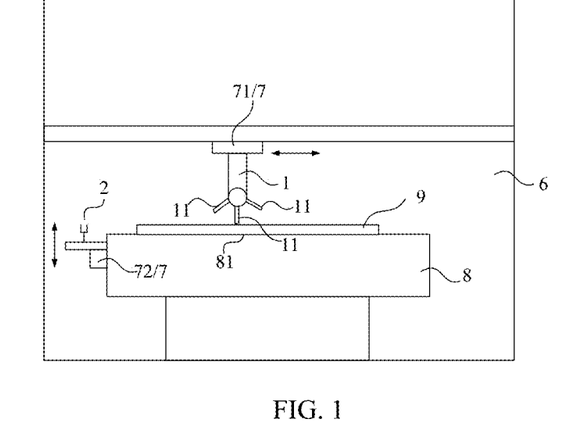
FIG. 1 is a schematic structural view of an inkjet printing device provided by at least one embodiment of the present disclosure.
Figure 3A:
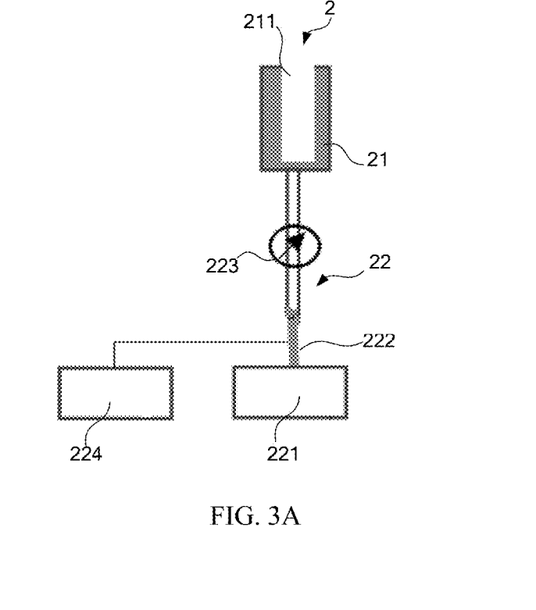
FIGS. 3A and 3B are schematic structural views of a cleaner component in some embodiments of the present disclosure (the number of a cleaner is one)
Figure 3B:
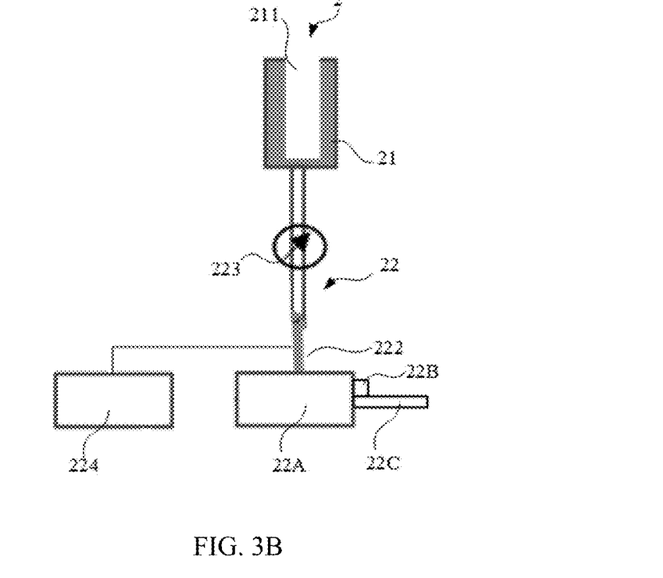

The embodiments of the present disclosure provide the inkjet printing device. As shown in FIG. 1, the inkjet printing device includes a printing sprayer head 1. The printing sprayer head 1 includes nozzles 11. The inkjet printing device further includes a cleaner component 2. As shown in FIGS. 3A and 3B, the cleaner component 2 includes a cleaner 21 and a vacuum system 22. The cleaner 21 is configured to be communicated with the nozzle 11 and is communicated with the vacuum system 22. For instance, as shown in FIGS. 3A and 3B, the cleaner 21 is provided with a nozzle hole 211 into which the nozzle 11 can be inserted, and the nozzle hole 211 is communicated with the vacuum system 22. In at least some other embodiments, the cleaner 21 may be a sleeve capable of being inserted into the nozzle 11 and attached to the nozzle 11, or the cleaner 21 may be communicated with the nozzle 11 through a guiding pipe.

Figure 6:
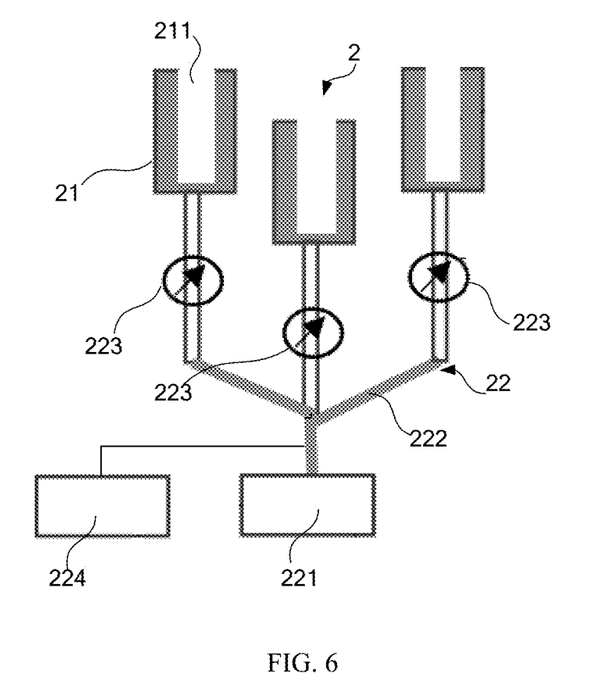
FIG. 6 is a schematic structural view of the cleaner component in at least another embodiment of the present disclosure (the number of the cleaners is three).

For instance, as shown in FIGS. 3A and 3B, the cleaner 21 may be a cleaning sleeve. For instance, the nozzle hole 211 is a central hole of the cleaning sleeve. For instance, the cleaner 21 may be made from an elastic material such as rubber, so as to ensure the sealability between the nozzle 11 and the wall of the nozzle hole 211 in a situation where the nozzle 11 is inserted into the nozzle hole 211. For instance, in the situation where the nozzle 11 is inserted into the nozzle hole, an outer wall of the nozzle 11 contacts the wall of the nozzle hole 211, so as to realize the sealed connection between the nozzle 11 and the nozzle hole 211. For instance, the number of the cleaner 21 may be one (as shown in FIGS. 3A and 3B) or may be multiple (as shown in FIG. 6) and is determined according to the design of the nozzle 11.

The inkjet printing device provided by the embodiments of the present disclosure further includes the cleaner component 2 which includes the cleaner 21 and the vacuum system 22, and the cleaner 21 is provided with the nozzle hole 211 which is communicated with the vacuum system 22. In this way, if the nozzle 11 is blocked in the printing process of the inkjet printing device, the nozzle 11 can be inserted into the nozzle hole 211, then the vacuum system 22 is started, and then the blockage in the nozzle 11 can be sucked out under the action of the suction of the vacuum system 22, so as to ensure the normal operation of the inkjet printing device. The cleaner component 2 in the inkjet printing device cleans the blockage in the nozzle 11 through the suction produced by the negative pressure in the vacuum system 22, thus the cleaning process is simplified, and the nozzle 11 is not required to be disassembled for clear-out, so the time required for cleaning the nozzle 11 is greatly saved, which is conducive to improving the working efficiency of the inkjet printing device.

In addition, the cleaner component 2 cleans the blockage in the nozzle 11, which can also eliminate the phenomenon that the ink droplets are seriously deviated from the orientation of the nozzle 11 caused by partial blockage of the nozzle 11, and then ensure the collimation of the nozzle 11, so that the ink droplets can be accurately sprayed out towards the orientation of the nozzle 11.

For instance, the vacuum system 22 includes an exhauster (for instance, a vacuum pump 221 in FIG. 3A, or a combination of a pumping tube 22A and a pumping tube driver component 22B in FIG. 3B, or other types of exhausters) and a connecting pipe 222. The exhauster is communicated with the cleaner 21 through the connecting pipe 222. Thus, the exhauster is configured to perform a gas pumping operation on the cleaner 21 to suck out the blockage in the nozzle 11. For instance, as shown in FIGS. 3A and 3B, in the situation where the cleaner 21 includes the nozzle hole, the exhauster is connected with the nozzle hole 211 through the connecting pipe 222, so as to form a channel between the vacuum pump 221 and the nozzle hole 211.

In the above cleaner component 2, the vacuum system 22 may have various structures.

For example, the vacuum system 22 may be of the following structure: as shown in FIG. 3A, the vacuum system 22 includes the vacuum pump 221 and the connecting pipe 222; and the vacuum pump 221 is connected with the nozzle hole 211 through the connecting pipe 222, so that the channel is formed between the vacuum pump 221 and the nozzle hole 211. In the cleaning process, the vacuum pump 221 extracts gas to form suction, and under the action of the suction, the blockage in the nozzle 11 can be sucked out of the nozzle 11.

For instance, the vacuum system 22 may be of the following structure: as shown in FIG. 3B, the vacuum system 22 includes the pumping tube 22A, the pumping tube driver component 22B (for instance, a motor or other types of drivers) and the connecting pipe 222; the pumping tube 22A is connected with the nozzle hole 211 through the connecting pipe 222, so that the channel is formed between the pumping tube 22A and the nozzle hole 211; and the pumping tube driver component 22B is configured to drive a piston rod 22C of the pumping tube 22A to perform back and forth movement. In the cleaning process, the pumping tube driver component 22B drives the piston rod 22C of the pumping tube 22A to move, so that the pumping tube 22A can produce suction, and under the action of the suction, the blockage in the nozzle 11 can be sucked out.

Compared with the embodiments in which the vacuum system 22 includes the pumping tube 22A, in the embodiments in which the vacuum system 22 includes the vacuum pump 221, the vacuum pump 221 produces suction by rotation, so the space occupied by the vacuum pump 221 is smaller; and meanwhile, the vacuum pump 221 can produce continuous suction and has a better cleaning effect.

In the embodiments in which the vacuum system 22 includes the vacuum pump 221 or the pumping tube 22A, for example, the vacuum system 22 may include a pressure measurer component. For instance, as shown in FIGS. 3A and 3B, the vacuum system 22 includes the exhauster (referring to the vacuum pump 221 and the pumping tube 22A), the connecting pipe 222 and the pressure measurer component 223; the exhauster is connected with the nozzle hole 211 through the connecting pipe 222; and the pressure measurer component 223 is configured to measure a pressure in the connecting pipe 222. For instance, in some embodiments, the vacuum system 22 may not include the pressure measurer component 223. Compared with the embodiments in which the vacuum system is not provided with the pressure measurer component 223, in the embodiments in which the vacuum system 22 is provided with the pressure measurer component 223, in the process of cleaning the blockage in the nozzle 11, whether the cleaner component 2 completes the removal of the blockage can be determined according to the pressure in the connecting pipe 222 measured by the pressure measurer component 223. Thus, the embodiment can reduce time waste, be conducive to shortening the cleaning time, and further improve the working efficiency of the inkjet printing device.

For instance, the pressure measurer component 223 may be a pressure gauge and may also be a pressure sensor. No specific limitation will be given here.

For instance, as shown in FIGS. 3A and 3B, the vacuum system 22 further includes a recycler unit 224 which is communicated with the connecting pipe 222. In the cleaning process, the vacuum pump 221 may suck the blockage in the nozzle 11 into the recycler unit 224.

Figure 2A:
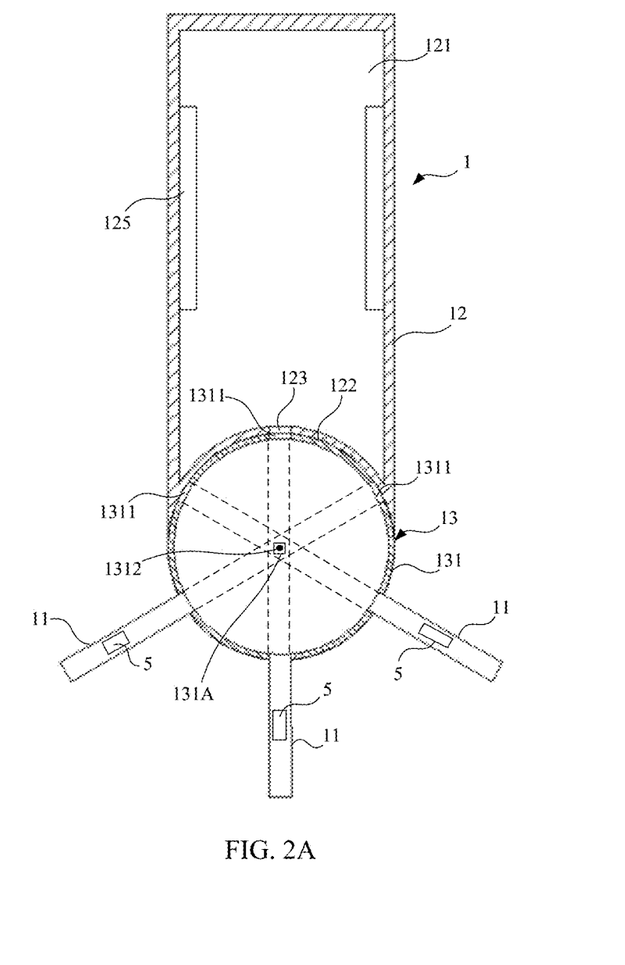
FIGS. 2A and 2B are schematic structural views of a printing sprayer head in the embodiments of the present disclosure.
Figure 2B:
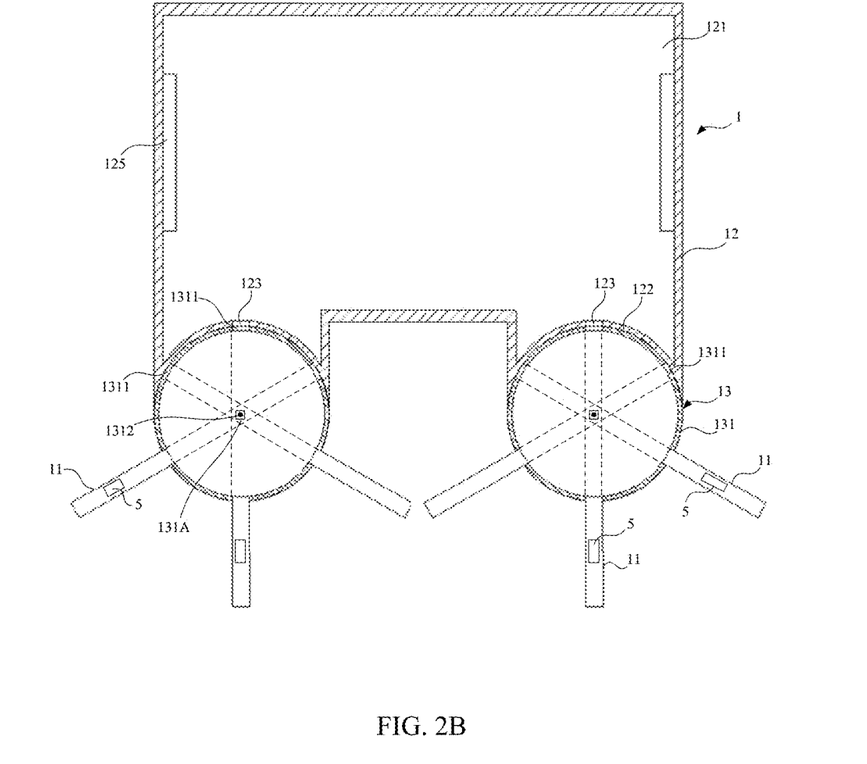
Figure 5:
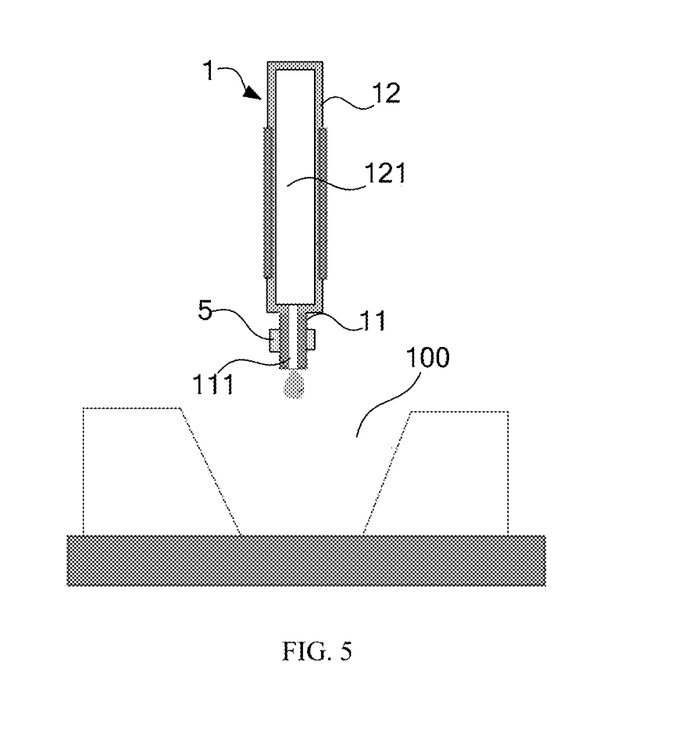
FIG. 5 is a schematic diagram illustrating a process that a nozzle sprays an ink droplet into a pixel hollow in at least one embodiment of the present disclosure.

In the printing sprayer head 1, as shown in FIG. 5, the number of the nozzle 11 may be one. In some other embodiments, for instance, the number of the nozzles 11 may be multiple. For instance, as shown in FIGS. 2A and 2B, the printing sprayer head 1 further includes a sprayer body 12 and a valve 13; a plurality of nozzles 11 are all connected with the sprayer body 12; and the valve 13 is configured to control the switching of each nozzle 11 between an open state and a closed state. Compared with the embodiments in which the number of the nozzle 11 is one, in the embodiments in which the number of the nozzles 11 is multiple, in the printing process, if one of the plurality of nozzles 11 is blocked, the valve 13 can close the blocked nozzle 11 and open another nozzle 11 which is not blocked to replace the blocked nozzle 11 to continue working, so as to ensure the working continuity of the inkjet printing process, thereby being conducive to improving the printing quality of the inkjet printing device.

It should be noted that: in the embodiments in which the number of the nozzles 11 is multiple, after a plurality of substrates are printed, the cleaner component 2 can clean the blockages in the plurality of nozzles 11 together.

In the embodiments in which the number of the nozzles 11 is multiple, there are many connection modes between each nozzle 11 and the sprayer body 12.

For instance, each nozzle 11 can be rotatably connected with the sprayer body 12. For instance, as shown in FIGS. 2A and 2B, the printing sprayer head 1 further includes a rotary driver component 131A which is configured to control the rotation of the nozzle 11. As for each nozzle 11, the nozzle 11 is movably connected with the sprayer body 12, and the rotary driver component 131A is configured to drive the nozzle 11 to rotate around an axis 1312 (for instance, a central axis of the control tube 131 in FIGS. 2A and 2B) relative to the sprayer body 12, so as to switch the nozzle 11 between an operating position and a non-operating position. In a situation where the nozzle 11 is at the operating position (for instance, a position where the nozzle 11 faces down directly, namely the position of the nozzle 11 in the middle in FIGS. 2A and 2B), the valve 13 opens the nozzle 11 at the operating position. In a situation where the nozzle 11 is at the non-operating position (for instance, a position where the nozzle 11 faces down obliquely, namely the positions of the nozzles 11 on two sides in FIGS. 2A and 2B), the valve 13 closes the nozzle 11 at the non-operating position. Before the inkjet printing operation starts, the rotary driver component 131A rotates the nozzle 11 that is to spray the ink to the operating position and rotates other nozzles 11 that are not to spray the ink to the non-operating positions, so as to avoid the case that the plurality of nozzles 11 spray ink at the same time. If the nozzle 11 is blocked in the printing process, the rotary driver component 131A rotates the blocked nozzle 11 to the non-operating position and rotates another nozzle 11 which is not blocked to the operating position, so that the another nozzle 11 replaces the blocked nozzle 11 to continue working.

In at least another embodiment, each nozzle 11 can be fixedly connected with the sprayer body 12, each nozzle 11 is disposed at the operating position (for instance, the position where the nozzle 11 faces down directly), and each nozzle 11 is provided with the valve 13. In the working process, the valve 13 at the nozzle 11 that is to spray the ink is opened, and the valves 13 at the nozzles 11 that are not to spray the ink are closed, so as to avoid the case that the plurality of nozzles 11 spray ink at the same time. If the nozzle 11 is blocked in the printing process, the valve 13 at the blocked nozzle 11 is closed, and the valve 13 at another nozzle 11 which is not blocked is opened to replace the blocked nozzle 11 to continue working.

In the embodiments in which each nozzle 11 is rotatably connected with the sprayer body 12, there are many connection modes between the nozzle 11 and the sprayer body 12. For instance, as shown in FIGS. 2A and 2B, the plurality of nozzles 11 can be rotatably connected with the sprayer body 12 through a same control tube 131. For instance, as shown in FIGS. 2A and 2B, the sprayer body 12 includes an ink chamber 121; a concave surface 122 (for instance, the concave surface 122 is concave towards the ink chamber 121) is disposed at a lower end of the sprayer body 12 (the end of the sprayer body 12 close to the nozzle 11); a first connecting hole 123 is formed at the concave surface 122 and is communicated with the ink chamber 121; the valve 13 includes the control tube 131 which is horizontally arranged (namely the central axis of the control tube is along the horizontal direction); the rotary driver component 131A is configured to drive the control tube 131 to rotate around the central axis of the control tube 131; a plurality of second connecting holes 1311 are also formed at a lateral surface of the control tube 131 (namely the surface which is included by the control tube 131 and is parallel to the central axis of the control tube 131), and the plurality of second connecting holes are spaced apart from each other along a circumferential direction of the control tube 131; the first connecting hole 123 and the plurality of second connecting holes 1311 are disposed in the same plane perpendicular to the central axis of the control tube 131; the plurality of nozzles 11 are all connected with the lateral surface of the control tube 131 and are spaced apart from each other along the circumferential direction of the control tube 131; each nozzle 11 is communicated with the second connecting hole 1311 that each nozzle 11 corresponds to; the central axis of the control tube 131 is the axis 1312. As for each nozzle 11, with the rotation of the control tube 131 around the central axis of the control tube 131, in the situation where the nozzle 11 rotates to the operating position, the second connecting hole 1311 communicated with the nozzle 11 is opposite to the first connecting hole 123 (namely this second connecting hole 1311 is communicated with the first connecting hole 123); and the lateral surface of the control tube 131 is sealed and attached with the concave surface 122 (so as to avoid ink leakage). In the working process, which nozzle 11 is opened or closed can be controlled by allowing the control tube 131 to rotate towards different positions.

For instance, the case that the second connecting hole 1311 communicated with the nozzle 11 is opposite to the first connecting hole 123 may be that the second connecting hole 1311 communicated with the nozzle 11 is entirely opposite to the first connecting hole 123, or may be that the second connecting hole 1311 communicated with the nozzle 11 is partially opposite to the first connecting hole 123, and no specific limitation will be given here. The case that the first connecting hole 123 and the plurality of second connecting holes 1311 are disposed in the same plane perpendicular to the central axis of the control tube 131 refers to that the first connecting hole 123 and the plurality of second connecting holes 1311 are intersected with the same plane perpendicular to the central axis of the control tube 131. The rotary driver component 131A, for example, a micromotor disposed at the sprayer body 12.

In at least another embodiment, each nozzle 11 may be rotatably connected with the sprayer body 12 through one control tube 131. For instance, as shown in FIG. 2B, the sprayer body 12 includes the ink chamber 121; a plurality of concave surfaces 122 are disposed at the lower end of the sprayer body 12; each concave surface 122 is provided with the first connecting hole 123 which is connected with the ink chamber 121; the valve 13 includes a plurality of control tubes 131; the number of the rotary driver components is multiple. As for each control tube 131, the control tube 131 is horizontally arranged, and the lateral surface of the control tube 131 is respectively sealed and attached with the corresponding concave surface 122 (for instance, the lateral surface of the control tube 131 contacts the corresponding concave surface 122); the control tube 131 is connected with the corresponding rotary driver component; the lateral surface of each control tube 131 is provided with the second connecting hole 1311; the nozzle 11 is disposed at the lateral surface of the control tube 131 and is communicated with the second connecting hole 1311; the rotary driver component is configured to drive the control tube 131 to rotate around the central axis of the control tube 131; and with the rotation of the control tube 131 around the central axis of the control tube 131, in the situation where the nozzle 11 rotates to the operating position, the second connecting hole 1311 communicated with the nozzle 11 is opposite to the first connecting hole 123.

Compared with the embodiments in which each nozzle 11 is rotatably connected with the sprayer body 12 through one control tube 131, in the embodiments in which the plurality of nozzles 11 are rotatably connected with the sprayer body 12 through the same control tube 131 (as shown in FIG. 2A), whether the plurality of nozzles 11 are opened or closed can be controlled by the rotation of one control tube 131; thus, one rotary driver component can be arranged to drive the control tube 131 to rotate, so as to control whether the plurality of nozzles 11 are opened or closed, which is conducive to leading to a more compact structure of the printing sprayer head 1 and reducing the occupied space of the printing sprayer head 1. Meanwhile, because the plurality of nozzles 11 are all connected with one control tube 131, in the switching process of the plurality of nozzles 11 between the operating position and the non-operating position, the position between two adjacent nozzles 11 remains relatively fixed, so as to avoid the motion interference between two adjacent nozzles 11.

In a situation where the nozzle 11 rotates to the operating position, the orientation of the nozzle 11 may be vertically downward or may form a certain included angle with the vertical direction. No specific limitation will be given here.

In the embodiments in which the orientation of the nozzle 11 is vertically downward in the situation where the nozzle 11 rotates to the operating position, the position of the first connecting hole 123 at the concave surface 122 and the positions of the nozzle 11 and the second connecting hole 1311 at the control tube 131 may have various setting modes. For instance, as shown in FIGS. 2A and 2B, the axis of the first connecting hole 123 is vertically arranged, that is, the first connecting hole 123 is disposed at the highest position of the concave surface 122; and a difference between the position of each nozzle 11 in the circumferential direction of the control tube 131 and the position of the corresponding second connecting hole 1311 in the circumferential direction of the control tube 131 is 180°. In at least another embodiment, the following arrangement may be adopted: there is a certain included angle θ, e.g., 60°, between the axis of the first connecting hole 123 and the vertical direction; and the difference between the position of each nozzle 11 in the circumferential direction of the control tube 131 and the position of the corresponding second connecting hole 1311 in the circumferential direction of the control tube 131 is (180°-θ), e.g., 120°. Compared with the embodiments in which there is the certain included angle θ between the axis of the first connecting hole 123 and the vertical direction and the difference between the position of each nozzle 11 in the circumferential direction of the control tube 131 and the position of the corresponding second connecting hole 1311 in the circumferential direction of the control tube 131 is (180°-θ), in the embodiments in which the axis of the first connecting hole 123 is vertically arranged and the difference between the position of each nozzle 11 in the circumferential direction of the control tube 131 and the position of the corresponding second connecting hole 1311 in the circumferential direction of the control tube 131 is 180° (as shown in FIGS. 2A and 2B), in a situation where one nozzle 11 is at the operating position, the downward difference between the second connecting hole 1311 and the nozzle 11 in the vertical direction is the largest, and the ink droplet in the ink chamber 121 can be sprayed vertically downwards from the nozzle 11 under the action of gravity, so the spraying of the ink droplet can be smoother.

Figure 4A:
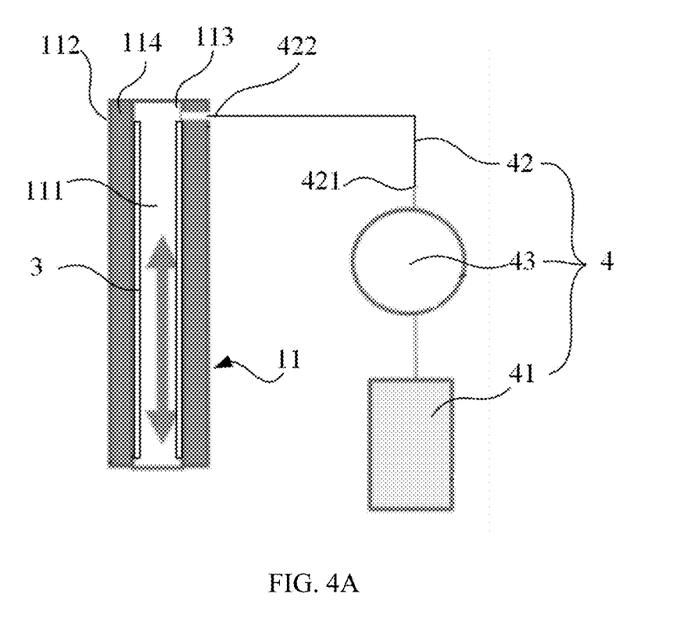
FIGS. 4A and 4B are schematic structural views of an ink droplet driver component in the embodiments of the present disclosure.
Figure 4B:
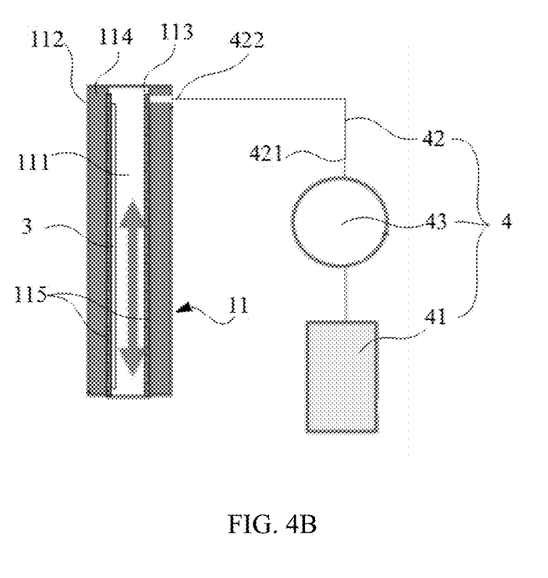

As shown in FIGS. 4A and 4B, the printing sprayer head 1 further includes a pressure sensor 3 which is configured to measure the pressure in the inkjet hole of the nozzle 11. In the printing process, if the pressure measured by the pressure sensor 3 is higher than a set value, it can be determined that the nozzle 11 is blocked. At this point, the cleaner component 2 can be adopted to clean the blockage in the nozzle 11, so as to ensure the continuous operation of the inkjet printing device. In addition, a blockage degree of the nozzle 11 can also be determined according to the value of the pressure measured by the pressure sensor 3, that is, in a situation where the pressure measured by the pressure sensor 3 is higher than the default value, the larger the pressure measured by the pressure sensor 3 is, the more serious the blockage of the nozzle 11 is, and then it is more necessary to clean the blockage in the nozzle 11 in time.

For instance, before inkjet printing, the pressure sensor 3 can perform pressure calibration in a situation where the nozzle 11 pre-sprays the first droplet of the ink, and at this point, the value measured by the pressure sensor 3 may be taken as the set value.

In the situation where the printing sprayer head 1 includes the plurality of nozzles 11, a plurality of the pressure sensors 3 may be provided, and each pressure sensor 3 can measure the pressure in the inkjet hole of one nozzle 11. In the printing process, if the pressure measured by the pressure sensor 3 connected with the nozzle 11 that is in operating is higher than the set value, it can be determined that the nozzle 11 is blocked, then the nozzle 11 can be closed, and another nozzle 11 which is not blocked can be adopted to replace the nozzle that is blocked for work, so as to ensure the working continuity of the inkjet printing device.

For instance, the type and the setting position of the pressure sensor 3 may have various implementations. For instance, as shown in FIGS. 4A and 4B, the pressure sensor 3 may be a thin-film pressure sensor and is disposed at the wall of the inkjet hole. In at least another embodiment, the pressure sensor 3 may be a micro liquid pressure sensor and is disposed at an inlet of the inkjet hole. Compared with the micro liquid pressure sensor, the thin-film pressure sensor is a planar pressure sensor, and the measuring range of the thin-film pressure sensor can cover the entire inkjet hole, so that the pressure measured by the thin-film pressure sensor can be more accurate.

In the operating process of the printing sprayer head 1, the ink droplets are subjected to the action of force in the ink chamber 121 of the sprayer body 12; for instance, as shown in FIG. 2, a piezoelectric material 125 is applied with a voltage and thus deforms, so that the volume of the ink chamber 121 is changed, thus the ink chamber 121 extrudes the ink droplets, and then the ink droplets enter the inkjet hole 111 of the nozzle 11; and after the ink droplets enter the inkjet hole 111 of the nozzle 11, due to factors such as resistance in the inkjet hole 111, the phenomenon that the ink droplets cannot be smoothly sprayed out of the inkjet hole 111 may occur. In view of this, for instance, as shown in FIGS. 4A and 4B, the inkjet printing device further includes an ink droplet driver component 4 which includes a gas supply source 41, a vent pipe 42 and a control valve 43; a first end 421 of the vent pipe 42 is connected with the gas supply source 41, and a second end 422 the thin-film pressure sensor 42 is connected with the inkjet hole 111; the control valve 43 is disposed at the vent pipe 42; and the opening of the control valve 43 is adjustable. Because the gas supply source 41 is connected with the inkjet hole 111 through the vent pipe 42 and the control valve 43 is disposed at the vent pipe 42, in the inkjet process of the nozzle 11, the gas supply source 41 introduces gas into the inkjet hole 111 at an appropriate speed by control of the opening of the control valve 43, so the gas can have the function of pushing the ink droplets in the inkjet hole 111, and then the ink droplets can smoothly pass through the inkjet hole 111.

For instance, the connecting position between the second end 422 of the vent pipe 42 and the inkjet hole 111 may have various setting modes. For instance, as shown in FIGS. 4A and 4B, the connecting position between the second end 422 of the vent pipe 42 and the inkjet hole 111 may be arranged to be close to an inlet end of the inkjet hole 111. In at least another embodiment, the connecting position between the second end 422 of the vent pipe 42 and the inkjet hole 111 may be disposed in the middle of the inkjet hole 111. Compared with the mode in which the connecting position between the second end 422 of the vent pipe 42 and the inkjet hole 111 is disposed in the middle of the inkjet hole 111, in a situation where the connecting position between the second end 422 of the vent pipe 42 and the inkjet hole 111 is arranged to be close to the inlet end of the inkjet hole 111, after the ink droplets enter the inkjet hole 111, the ink droplets can be pushed by the gas in the overall process, so as to ensure that the ink droplet can more smoothly pass through the inkjet hole 111.

In the ink droplet driver component 4, the gas supply source 41 and the control valve 43 can be disposed at the printing sprayer head 1 or at other places. For instance, the vent pipe 42 is a flexible pipe. No specific limitation will be given here.

In order that the nozzle 11 has better collimation, for instance, as shown in FIGS. 4A and 4B, the nozzle 11 includes a housing 112 and a capillary tube 113; the capillary tube 113 is disposed in the housing 112; and a tube hole of the capillary tube 113 is the inkjet hole 111. Because the tube diameter of the capillary tube 113 is small (for instance, the capillary tube is a tube of which the inner diameter is equal to or less than 1 mm), the capillary tube has good collimation. Thus, after the ink droplet is sprayed out of the capillary tube 113, the ink droplet is sprayed out in the orientation of the outlet of the capillary tube 113, so as to avoid the path of the ink droplet from being deviated from the orientation of the outlet of the capillary tube 113, thereby ensuring that the ink droplet sprayed out of the nozzle 11 falls into a predetermined area.

For instance, the housing 112 of the nozzle 11 may be made of a rigid material (e.g., steel), so as to protect the capillary tube 113 in the housing 112 from being damaged under the action of an external mechanical force.

In order that the ink droplet passes through the capillary tube 113 more smoothly, for instance, as shown in FIG. 4B, the nozzle 11 further includes a hydrophobic layer 115 which covers the inner wall of the capillary tube 113. By arrangement of the hydrophobic layer 115, the tube wall of the capillary tube 113 can be smoother, and the ink droplet is no easily adhered to the tube wall of the capillary tube 113 in passing through the capillary tube 113. Thus, this case not only can guarantee better collimation of the capillary tube 113 so that the ink droplet can be sprayed out along the orientation of the outlet of the capillary tube 113, but also can prevent the ink droplet from generating air bubbles when the ink droplet passes through the capillary tube 113, so as to further prevent the generation of satellite ink generated due to bubble bursting after the ink droplet is sprayed out.

The nozzle 11 needs to move back and forth in the printing process to spray the ink into the pixel hollow of the substrate. In a situation where the nozzle 11 stops moving, due to motion inertia, the capillary tube 113 disposed in the housing 112 jitters. In order to prevent the capillary tube 113 from jittering, for instance, as shown in FIG. 4, the nozzle 11 further includes a buffer material layer 114 which is disposed between the housing 112 and the capillary tube 113. The arrangement of the buffer material layer 114 can limit the movement of the capillary tube 113 in the housing 112, and can better prevent the capillary tube 113 from jittering.

For instance, the buffer material layer 114 may be a rubber layer or may be other flexible material layers.

In the nozzle 11, the type of the capillary tube 113 may be various. For instance, the capillary tube 113 may be a carbon nano-tube or may be a common capillary tube 113. Compared with the common capillary tube 113, the diameter of the carbon nano-tube may be set to be smaller, for instance, the diameter of the carbon nano-tube may be set to be less than 30 µm, so the nozzle 11 can be manufactured to be smaller, so as to ensure higher positioning precision of the nozzle 11 in the process of adopting the nozzle 11 to print the substrate. In addition, the tube wall of the carbon nano-tube is smoother, and the friction force between the wall and the fluid can be ignored, so the ink droplet can run through more smoothly, without the need of arranging the hydrophobic layer at the inner wall.

In the process of printing the substrate, if the nozzle 11 sprays out too many ink droplets, the ink droplets will be overflowed from the pixel hollow 100 (as shown in FIG. 5) and flow into adjacent pixel hollows 100, so as to result in poor processes such as substrate color mixing. In view of this, for instance, as shown in FIGS. 2A, 2B and 5, the inkjet printing device further includes an optical detector component 5 which is configured to acquire an image of the pixel hollow 100 of the substrate that is printed. Thus, a control system of the inkjet printing device obtains parameters of the pixel hollow 100 such as the cross sectional area according to the image of the pixel hollow 100 acquired by the optical detector component 5, and then the control system of the inkjet printing device can acquire the volume, e.g., 60 pL, of the ink droplets sprayed into the pixel hollow 100 by the nozzle 11 after calculation. Subsequently, the control system of the inkjet printing device can adjust the number of the ink droplets to be sprayed by the nozzle 11, for instance, the inkjet volume of 5%-10% is reduced on the basis of 60 pL, so as to ensure that the liquid level in the pixel hollow 100 is not too high, thereby avoiding the poor processes such as substrate color mixing caused by the fact that the ink droplets are overflowed and flow into the adjacent pixel hollows 100.

For instance, the optical detector component 5 may be an automated optical inspection AOI) component.

The optical detector component 5 may have various setting positions. For instance, as shown in FIG. 5, the optical detector component 5 is disposed at the nozzle 11. Or in at least another embodiment, the optical detector component 5 may be disposed at other parts of the printing sprayer head 1; for instance, the optical detector component 5 may be disposed at the sprayer body 12. Compared with the case that the optical detector component 5 may being disposed at other parts of the printing sprayer head 1, in a situation where the optical detector component 5 is disposed at the nozzle 11, because the nozzle 11 is opposite to the pixel hollow 100 of the substrate in the printing process, the position between the optical detector component 5 and the pixel hollow 100 can be better, so the image of the pixel hollow 100 of the printed substrate acquired by the optical detector component 5 can be more accurate, and then the quantity of the ink sprayed into the pixel hollow 100 by the nozzle 11, calculated by the control system, can be more accurate.

In the process of cleaning the blockage in the nozzle 11, for instance, the nozzle 11 is inserted into the nozzle hole 211 of the cleaner 21, and the mode of inserting the nozzle 11 into the nozzle hole 211 of the cleaner 21 may be various. For instance, the cleaner 21 can move to the nozzle 11 automatically, and then the nozzle 11 is inserted into the nozzle hole 211. For instance, as shown in FIG. 1, the inkjet printing device further includes a printing chamber 6 and a driver component 7; the printing sprayer head 1, the cleaner component 2 and the driver component 7 are all disposed in the printing chamber 6; and under the driving of the driver component 7, relative movement in the horizontal direction and the vertical direction can occur between the cleaner component 2 and the printing sprayer head 1, so that the nozzle 11 can be inserted into the nozzle hole 211. In the cleaning process, the driver component 7 drives the printing sprayer head 1 and the cleaner component 2 to perform the relative movement in the horizontal direction and the vertical direction, so that the nozzle 11 can be smoothly inserted into the nozzle hole 211. In at least another embodiment, the cleaner 21 can move to the nozzle 11 by manual means, and then the nozzle 11 is manually inserted into the nozzle hole 211. Compared with the embodiments in which the cleaner 21 moves to the nozzle 11 by manual means, in the embodiments in which the cleaner 21 moves to the nozzle 11 by automatic means (as shown in FIG. 1), the cleaning operation of the nozzle 11 can be automatically completed and does not require manual involvement, so the automatization level of the inkjet printing device can be improved and the manual cost can be saved.

In the embodiments in which the cleaner 21 moves to the nozzle 11 by automatic means, the structure of the driver component 7 and the setting position of the cleaner component 2 may be various. For instance, the following setting mode can be adopted: as shown in FIG. 1, the inkjet printing device further includes a substrate carrier 8 which is disposed in the printing chamber 6; the printing sprayer head 1 is disposed on the upper side of the substrate carrier 8; the substrate carrier 8 includes a substrate placing area 81 for placing the substrate 9; the cleaner component 2 is movably disposed on the substrate carrier 8 and disposed outside of the substrate placing area 81; the axis of the nozzle hole 211 is vertically arranged; the driver component 7 includes a first driver component 71 and a second driver component 72; the first driver component 71 is configured to drive the printing sprayer head 1 to move relative to the substrate carrier 8 along the horizontal direction, so that the nozzle 11 can be opposite to the nozzle hole 211; and the second driver component 72 is configured to drive the cleaner component 2 to move relative to the substrate carrier 8 along the vertical direction. In the cleaning process, the printing sprayer head 1 moves to the upper side of the cleaner component 2 along the horizontal direction under the driving of the first driver component 71, and then the cleaner component 2 moves along the vertical direction under the driving of the second driver component 72, so that the nozzle 11 can be smoothly inserted into the nozzle hole 211.

For instance, both the first driver component 71 and the second driver component 72 may be a linear motion actuator or may adopt a driver component mainly including a motor and a feed screw nut.

In at least another embodiment, the following setting mode may be adopted: the cleaner component 2 is disposed outside the substrate carrier 8; the driver component 7 includes the first driver component 71 and the second driver component 72; the first driver component 71 is configured to drive the printing sprayer head 1 to move relative to the substrate carrier 8 along the horizontal direction; and the second driver component 72 is configured to drive the cleaner component 2 to move relative to the substrate carrier 8 along the horizontal direction and the vertical direction. In the cleaning process, the printing sprayer head 1 moves along the horizontal direction under the driving of the first driver component 71, so that the printing sprayer head 1 and the substrate carrier 8 are not opposite to each other (in order to avoid the motion interference between the cleaner component 2 and the substrate carrier 8); and subsequently, the cleaner component 2 moves to a position below the nozzle 11 along the horizontal direction under the driving of the second driver component 72, and then moves along the vertical direction under the driving of the second driver component 72, so that the nozzle 11 can be smoothly inserted into the nozzle hole 211. Compared with the embodiments in which the cleaner component 2 is disposed on the outside of the substrate carrier 8, in the embodiments in which the cleaner component 2 is movably disposed on the substrate carrier 8 and disposed on the outside of the substrate placing area 81, the structure of the driving component 7 is simpler, and the nozzle 11 can be smoothly inserted into the nozzle hole 211 by allowing the second driver component 72 to only drive the cleaner component 2 to move along the vertical direction, which is conducive to reducing the design and production cost of the driver component 7.

In the inkjet printing device provided by the embodiments of the present disclosure, the type of the printing sprayer head 1 may be a piezoelectric printing sprayer head 1 (as shown in FIG. 2), that is: the piezoelectric material 125 such as piezoelectric ceramics is mounted at a position near the nozzle 11 of the printing sprayer head 1, and the voltage applied to the piezoelectric material 125 is duly changed by utilization of the principle that the piezoelectric material 125 can be deformed under the action of voltage, so that the ink is sprayed out of the nozzle 11 by the expansion produced by the piezoelectric material 125. In at least another embodiment, the printing sprayer head 1 may be a thermal inkjet type printing sprayer head 1, that is: an electric heater is mounted at the position near the nozzle 11 of the printing sprayer head 1, and in the printing process, the heater heats the liquid in the pipe of the printing sprayer head 1, so that the liquid is vaporized to form air bubbles, and the bubbles rapidly expand to spray out the ink at the nozzle 11 to a printing medium surface.

In the description of the description, specific features, structures, materials or characteristics can be combined in any suitable manner in one or more embodiments or examples.

At least one embodiment of the present disclosure further provides an operation method of the inkjet printing device provided by any foregoing embodiment (for instance, as shown in FIGS. 1 to 6). The operation method includes: in the printing process, determining whether the nozzle 11 of the printing sprayer head 1 is blocked; and in presence of a determination result that the nozzle 11 is blocked, allowing the cleaner 21 to be communicated with the nozzle 11, and utilizing the vacuum system 22 to suck out the blockage in the nozzle. The operation method simplifies the cleaning process, does not need to disassemble the nozzle for clear-out, greatly saves the time required for cleaning the nozzle, and can improve the working efficiency of the inkjet printing device.

For instance, taking the inkjet printing device shown in FIGS. 2A and 2B as an example, the operation method further includes: in the printing process, in the situation where the nozzle 11 of the printing sprayer head 1 is blocked, after the blocked nozzle 11 is rotated to the non-operating position, using the vacuum system 22 (as shown in FIGS. 3A and 3B) to suck out the blockage in the nozzle 11, and rotating another nozzle 11 of the printing sprayer head 1 to the operating position to continue printing. The method can ensure the working continuity of the inkjet printing device and improve the printing quality of the inkjet printing device.

For instance, taking the inkjet printing device as shown in FIG. 4 as an example, the operation method further includes: in the printing process, introducing the gas into the nozzle 11 of the printing sprayer head 1, so as to ensure that the ink droplet more smoothly passes through the nozzle hole 111 of the nozzle 11.

In summary, in the embodiments of the present disclosure, because the inkjet printing device further includes the cleaner component which includes the cleaner and the vacuum system, and the cleaner is provided with the nozzle hole which is communicated with the vacuum system, in the printing process of the inkjet printing device, if the nozzle is blocked, the nozzle can be inserted into the nozzle hole, and the vacuum system is started, and the blockage in the nozzle can be sucked out under the action of the suction of the vacuum system, so as to ensure the normal operation of the inkjet printing device. The cleaner component in the inkjet printing device cleans the blockage in the nozzle by utilization of the suction produced by the negative pressure in the vacuum system. Therefore, the embodiments simplify the cleaning process, do not need to disassemble the nozzle for clear-out, greatly save the time required for cleaning the nozzle, and can improve the working efficiency of the inkjet printing device.

What are described above is related to the illustrative embodiments of the disclosure only and not limitative to the scope of the disclosure; the scopes of the disclosure are defined by the accompanying claims.

What is claimed is:

1. An inkjet printing device, comprising:
a printing sprayer head comprising a nozzle; and
a cleaner component comprising a cleaner and a vacuum system, wherein the cleaner is configured to be communicated with the nozzle and the cleaner is communicated with the vacuum system, and wherein the vacuum system comprises a pressure measurer component and a connecting pipe, and the pressure measurer component is configured to measure a pressure in the connecting pipe.

2. The inkjet printing device according to claim 1, wherein the vacuum system further comprises an exhauster, and the exhauster is communicated with the cleaner through the connecting pipe.

3. The inkjet printing device according to claim 1, wherein the cleaner is provided with a nozzle hole in which the nozzle is configured to be inserted, and the nozzle hole is communicated with the vacuum system.

4. The inkjet printing device according to claim 3, wherein the vacuum system further comprises an exhauster, and the exhauster is connected with the nozzle hole through the connecting pipe to form a channel between the exhauster and the nozzle hole.

5. The inkjet printing device according to claim 3, wherein:
the inkjet printing device further comprises a printing chamber and a driver component, and the printing sprayer head, the cleaner component and the driver component are in the printing chamber; and
under driving of the driver component, the cleaner component is movable relative to the printing sprayer head in both a horizontal direction and a vertical direction, so that the nozzle is insertable into the nozzle hole.

6. The inkjet printing device according to claim 5, wherein
the inkjet printing device further comprises a substrate carrier which is in the printing chamber, the printing sprayer head is on an upper side of the substrate carrier, the substrate carrier comprises a substrate placing area, the cleaner component is movably disposed on the substrate carrier and arranged outside the substrate placing area, and an axis of the nozzle hole is vertical;
the driver component comprises a first driver component and a second driver component;
the first driver component is configured to drive the printing sprayer head to move relative to the substrate carrier along the horizontal direction, so that the nozzle is opposite to the nozzle hole; and
the second driver component is configured to drive the cleaner component to move relative to the substrate carrier along the vertical direction.

7. The inkjet printing device according to claim 1, wherein the printing sprayer head comprises a plurality of nozzles, the printing sprayer head further comprises a sprayer body and a valve, the plurality of nozzles are all connected with the sprayer body, and the valve is configured to switch each nozzle between an open state and a closed state.

8. The inkjet printing device according to claim 7, wherein the printing sprayer head further comprises a rotary driver component;
as for each nozzle, the nozzle is movably connected with the sprayer body, and the rotary driver component is configured to drive the nozzle to rotate around an axis relative to the sprayer body and thus to switch the nozzle between an operating position and a non-operating position; and
as for each nozzle, the nozzle is opened by the valve in a situation where the nozzle is at the operating position, and the nozzle is closed by the valve in a situation where the nozzle is at the non-operating position.

9. The inkjet printing device according to claim 8, wherein
the sprayer body comprises an ink chamber, a concave surface is at an end of the sprayer body facing the nozzle, the concave surface is provided with a first connecting hole, and the first connecting hole is communicated with the ink chamber;
the valve comprises a control tube which is horizontally arranged; the rotary driver component is configured to drive the control tube to rotate around a central axis of the control tube and thus to drive the nozzle to rotate around the axis relative to the sprayer body, wherein the central axis of the control tube is the axis;

a plurality of second connecting holes are at a lateral surface of the control tube and are spaced apart from each other along a circumferential direction of the control tube, and the first connecting hole and the plurality of second connecting holes are in a same plane perpendicular to the central axis of the control tube;

the plurality of nozzles are all connected with the lateral surface of the control tube and are spaced apart from each other along the circumferential direction of the control tube, and each nozzle is configured to be communicated with a second connecting hole that each nozzle corresponds to; and as for each nozzle, with rotation of the control tube around the central axis of the control tube, in a situation where the nozzle rotates to the operating position, at least a portion of the second connecting hole communicated with the nozzle is opposite to the first connecting hole, and the lateral surface of the control tube is sealed with the concave surface.

10. The inkjet printing device according to claim 9, wherein an axis of the first connecting hole is vertically arranged; and a difference between a position of each nozzle in the circumferential direction of the control tube and a position of the second connecting hole that each nozzle corresponds to in the circumferential direction of the control tube is 180°.

11. The inkjet printing device according to claim 1, wherein the nozzle comprises an inkjet hole, and the printing sprayer head further comprises a pressure sensor which is configured to measure a pressure in the inkjet hole.

12. The inkjet printing device according to claim 11, wherein the pressure sensor is a thin-film pressure sensor and is at a wall of the inkjet hole.

13. The inkjet printing device according to claim 1, wherein:

the nozzle comprises an inkjet hole;

the inkjet printing device further comprises an ink droplet driver component which comprises a gas supply source, a vent pipe, and a control valve;

a first end of the vent pipe is connected with the gas supply source, and a second end of the vent pipe is connected with the inkjet hole; and the control valve is at the vent pipe, and an opening size of the control valve is adjustable.

14. The inkjet printing device according to claim 13, wherein a position where the second end of the vent pipe is connected with the inkjet hole is close to an inlet end of the inkjet hole.

15. The inkjet printing device according to claim 1, wherein the nozzle is provided with an inkjet hole and comprises a housing and a capillary tube, the capillary tube is in the housing, and a tube hole of the capillary tube is the inkjet hole.

16. The inkjet printing device according to claim 15, wherein the nozzle further comprises a hydrophobic layer which covers an inner wall of the capillary tube.

17. An operation method of the inkjet printing device according to claim 1, comprising:

in a printing process, determining whether the nozzle of the printing sprayer head is blocked; and in presence of a determination result that the nozzle is blocked, allowing the cleaner component to be communicated with the nozzle, and utilizing the vacuum system to suck out a blockage in the nozzle.

18. The operation method according to claim 17, further comprising:

in the printing process, in a situation where the nozzle of the printing sprayer head is blocked, rotating the nozzle that is blocked to a non-operating position, utilizing the vacuum system to suck out the blockage in the nozzle, and rotating another nozzle of the printing sprayer head to an operating position to continue printing.

19. The operation method according to claim 17, further comprising:

in the printing process, introducing a gas into the nozzle of the printing sprayer head.

* * * * *